United States Patent
Nagata et al.

(10) Patent No.: US 6,359,297 B1
(45) Date of Patent: Mar. 19, 2002

(54) SEMICONDUCTOR DEVICE WITH MOVEMENT OF POSITIVE ION PREVENTED

(75) Inventors: Takami Nagata; Satoshi Yamaguchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/447,214

(22) Filed: Nov. 23, 1999

(30) Foreign Application Priority Data

Nov. 30, 1998 (JP) .......................................... 10-338814

(51) Int. Cl.⁷ ....................... H01L 27/108; H01L 29/76; H01L 29/94; H01L 31/119
(52) U.S. Cl. ....................................... 257/296; 257/207
(58) Field of Search ................................. 257/207, 296

(56) References Cited

U.S. PATENT DOCUMENTS 5,847,430 A * 12/1998 Hidaka .......................... 257/355
6,118,158 A * 9/2000 Kim .............................. 257/369

FOREIGN PATENT DOCUMENTS

| JP | 59-228753 | 12/1984 |
| JP | 4-162660 | 6/1992 |
| JP | 2667432 | 6/1997 |

* cited by examiner

*Primary Examiner*—Tom Thomas
*Assistant Examiner*—Thien F Tran
(74) *Attorney, Agent, or Firm*—Sughrue Mion, PLLC

(57) ABSTRACT

A semiconductor device includes an interlayer formed to cover a semiconductor substrate, a circuit element, a preventing diffusion region, a power supply line and a ground line. The power supply line is formed on the interlayer to supply a positive voltage to the circuit element. The ground line is formed on the interlayer on an opposite side to the circuit element with respective to the power supply line. The circuit element is formed in a surface portion of a semiconductor substrate. The preventing diffusion region is formed in a surface portion of the semiconductor substrate in correspondence to the power supply line, and is applied with a predetermined positive voltage.

23 Claims, 2 Drawing Sheets

US 6,359,297 B1

SEMICONDUCTOR DEVICE WITH MOVEMENT OF POSITIVE ION PREVENTED

BACKGROUND OF THE INVENTION

1. Field of the Invention

The present invention relates to a semiconductor device in which movement of positive ions to a circuit element region can be prevented.

2. Description of the Related Art

In a semiconductor memory device, a ground wiring line is arranged in the neighbor of a cell block to stabilize a ground level to memory cells. The memory cells and a high potential wiring line are present in the neighbor of the ground wiring line.

FIG. 1 is a cross sectional view of a conventional semiconductor memory device in the neighbor of a memory cell block. In FIG. 1, first and second high potential wiring lines 123 and 124 and the cell blocks are in the neighbor of a ground wiring line 112 and are formed on an interlayer 151. When the semiconductor memory device is used in the environment of the temperature of about 85° C. and the humidity of about 70%, positive ions are generated for the influence of very small quantity of moisture and are attracted to the ground wiring line 112. The positive ions are attracted to the ground wiring line or the memory cells in the neighbor of the ground wiring line while diffusing toward the ground wiring line 112. Thus, the charge is collected and stored in the ground wiring line or diffusion layers of the memory cells. As a result, current flows between the ground wiring line and the cells to cause an erroneous operation.

In conjunction with the above description, a semiconductor device is described in Japanese Laid Open Patent Application (JP-A-Showa 59-228753). In this reference, a conductive wiring layer is formed above a silicon film as a resistance element to cover a junction section between a high resistance portion of the silicon film and a low resistance portion. A passivation film is formed on the conductive wiring layer.

Also, a semiconductor device is described in Japanese Laid Open Patent Application (JP-A-Heisei 4-162660). In this reference, a main portion of a high resistance element is surrounded by an insulating film, and a pair of electrodes are provided above and below the high resistance element and are connected to a wiring layer supplied with a predetermined voltage.

Also, a semiconductor device is described in Japanese Patent No. 2,667,432. In this reference, a positive bias is applied to a semiconductor substrate. An element region is formed in a well region which is formed in the semiconductor substrate. An insulating film is formed to cover the element region. A wiring line is formed on the insulating film to cover the element region and is set to a predetermined potential.

SUMMARY OF THE INVENTION

Therefore, an object of the present invention is to provide a semiconductor device in which an erroneous operation due to a positive ion can be prevented.

In order to achieve an aspect of the present invention, a semiconductor device includes an interlayer formed to cover a semiconductor substrate, a circuit element, a preventing diffusion region, a power supply line and a ground line. The power supply line is formed on the interlayer to supply a positive voltage to the circuit element. The ground line is formed on the interlayer on an opposite side to the circuit element with respective to the power supply line. The circuit element is formed in a surface portion of a semiconductor substrate. The preventing diffusion region is formed in a surface portion of the semiconductor substrate in correspondence to the power supply line, and is applied with a predetermined positive voltage.

Here, the predetermined positive voltage may be equal to or lower than the positive voltage supplied from the power supply line.

Also, the semiconductor device may include a plurality of the preventing diffusion regions applied with the predetermined positive voltages which are different.

Also, it is preferable that the preventing diffusion region is provided substantially directly below the power supply line.

In addition, the semiconductor device may be a semiconductor memory device and the circuit element may be a memory cell. In this case, a memory cell transistor may be formed in the interlayer.

In order to achieve another aspect of the present invention, a semiconductor device includes a circuit element, an interlayer, a ground line, a power supply line, and a diffusion region. The circuit element is formed in a surface portion of a semiconductor substrate. The interlayer is formed to cover the semiconductor substrate. The ground line is biased to a ground potential. The power supply line is formed on the interlayer on the side of the circuit element from the ground line to generate a first electric field toward the ground line in the interlayer. The diffusion region formed in a surface portion of the semiconductor substrate to generate a second electric field toward the ground line in the interlayer such that a movement of a positive ion toward the circuit element is prevented by the first and second electric fields in the interlayer.

Here, the diffusion region may be provided in correspondence to the power supply line. Especially, it is preferable that the diffusion region is provided substantially directly below the power supply line.

Also, when a predetermined positive voltage is applied to the diffusion region, the predetermined positive voltage may be equal to or lower than a positive voltage supplied from the power supply line.

Also, the semiconductor device includes a plurality of the diffusion regions applied with the predetermined positive voltages which are different.

Also, the semiconductor device is a semiconductor memory device and the circuit element is a memory cell. In this case, a memory cell transistor may be formed in the interlayer.

DESCRIPTION OF THE PREFERRED EMBODIMENTS

Hereinafter, the semiconductor memory device of the present invention will be described below in detail with reference to the attached drawings.

Figure 1:
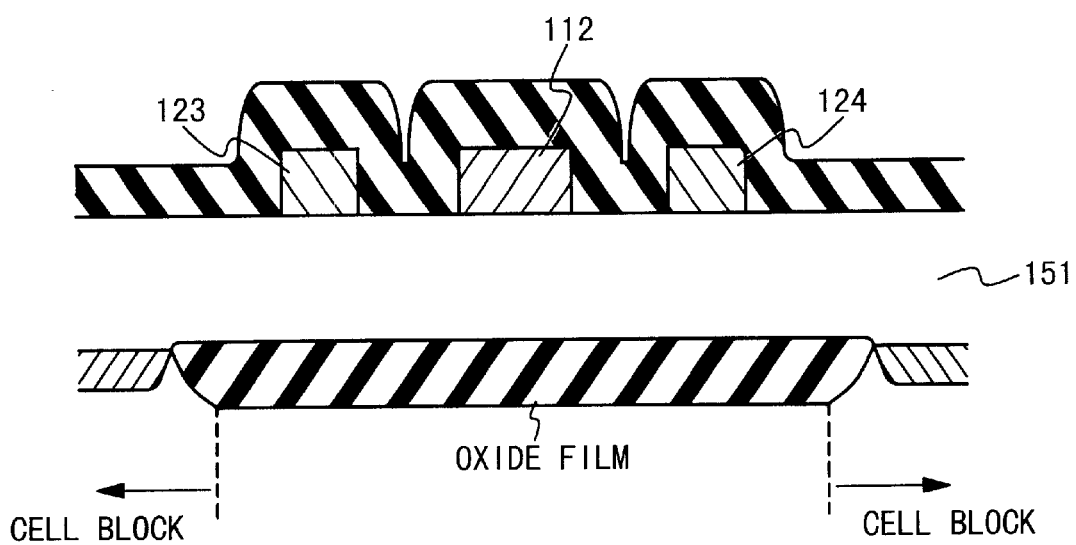
FIG. 1 is a cross sectional view of a conventional semiconductor memory device at an end portion of a cell block.
Figure 2:
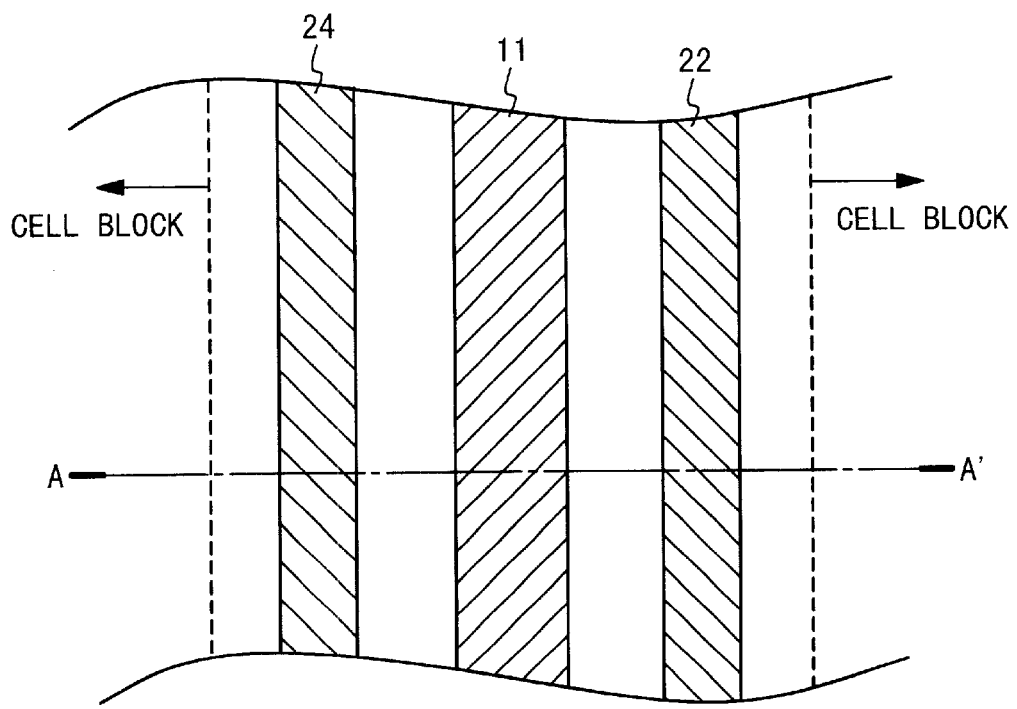
FIG. 2 is a plan view shows a semiconductor memory device according to an embodiment of the present invention at an end portion of a cell block.

FIG. 2 is a plan view of the semiconductor memory device according to an embodiment of the present invention at an end portion of cell blocks. Referring to FIG. 2, a first ground wiring line 11, a first high potential wiring line 24 and a second high potential wiring line 22 are arranged in the neighbor of the cell block. The ground potential line 11 is interposed between the first and second high potential wiring lines 24 and 22.

Figure 3:
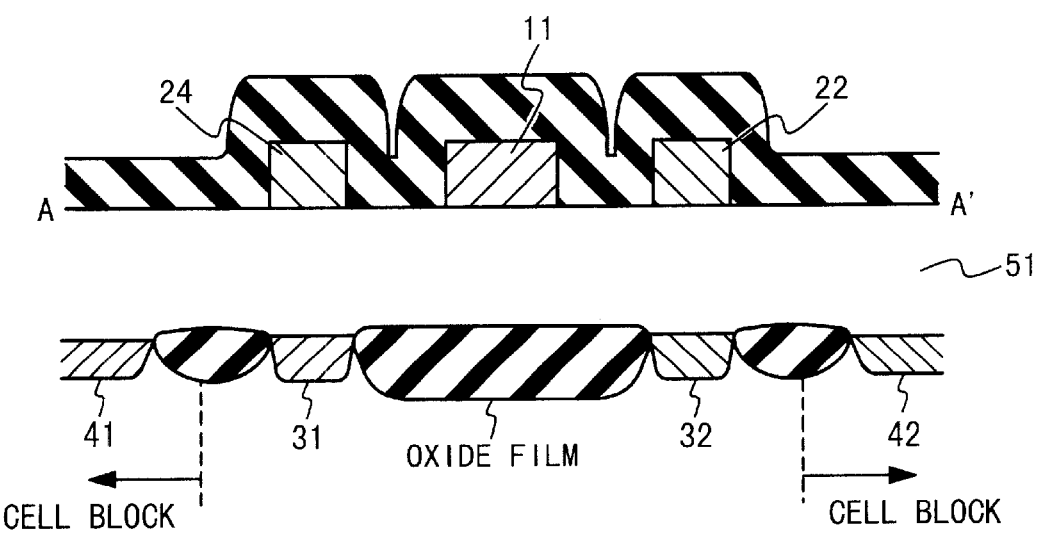
FIG. 3 is a cross sectional view of the semiconductor memory device according to the embodiment of the present invention along the line A–A' in FIG. 2.

Also, FIG. 3 is a cross sectional view of the semiconductor memory device according to an embodiment of the present invention along the line A–A' of FIG. 2. As shown in FIG. 3, cell blocks as circuit elements are formed in the surface portions of a semiconductor substrate. Also, a first diffusion layer 31 and a second diffusion layer 32 are formed in surface portions of the semiconductor substrate between the cell blocks. The cell blocks have third and fourth diffusion regions 41 and 42, respectively. Element separation insulating (oxide) films are formed between the third diffusion region 41 and the first diffusion region 31, between the first diffusion region 31 and the second diffusion region 32, and between the second diffusion region 32 and the fourth diffusion region 42, respectively.

An interlayer 51 such as an interlayer insulating film is formed on the semiconductor substrate. Memory cell transistors may be formed in the interlayer. First and second high potential wiring lines 24 and 22, and a ground potential wiring line 11 are formed on the interlayer between the cell blocks. The ground potential wiring line 11 is formed to be sandwiched by the first and second high potential wiring lines 24 and 22.

The first diffusion region 31 and the second diffusion region 32 are arranged in correspondence to the first high potential wiring line 24 and the second high potential wiring line 22, respectively. The potentials of the first diffusion region 31 and second diffusion region 32 are the same as those of the first and second high potential wiring lines 24 and 22, respectively. However, the potentials of the first diffusion region 31 and second diffusion region 32 may be positive potentials different from those of the first and second high potential wiring lines 21 and 22, and may be different from each other.

Also, the third diffusion region 41 and the fourth diffusion region 42 are arranged as diffusion regions of the cells at the end portions of the cell blocks in correspondence to the first diffusion region 31 and the second diffusion region 32, respectively.

The first and second diffusion regions 31 and 32 are desired to be provided directly below the first and the second high potential wiring lines 24 and 22.

In this way, the ground wiring line 11, the high potential wiring lines 24 and 22 and the diffusion regions with positive potentials 31 and 32 are arranged to generate positive electric fields. As a result, while positive ions are diffused toward the ground wiring line 11, and attracted to the ground wiring line, the high potentials or the positive electric fields prevents the diffusion of the positive ions to the cell blocks. As a result, any erroneous operation of the semiconductor memory device due to the positive ions can be prevented. Also, the high potential or the positive electric field could stop the movement of the positive ions in the region of the cell block.

As described above, according to the semiconductor memory according to the present invention, conductive layers are laid out such that the positive ions generated in the semiconductor memory device do not reach the cell block region. The diffusion regions applied with positive potentials which are equal to or lower than the power supply potential are provided for every two cell blocks to sandwich element separation oxide film. The high potential wiring lines 24 and 22 are arranged above the diffusion regions 31 and 32, and the ground wiring line 11 is arranged between the high potential wiring lines 24 and 22. Thus, invasion of the positive ions from outside the semiconductor memory device is prevented, and even if the positive ions invade, invasion of the positive ions into the region of the cell block can be prevented.

It should be noted that the ground line is provided on the interlayer in the above description. However, the ground line may be provided in the interlayer or on the semiconductor substrate.

What is claimed is:

1. A semiconductor device comprising:
    a circuit element formed in a surface portion of a semiconductor substrate and located in a first cross-sectional region of said semiconductor device;
    an interlayer that covers said semiconductor substrate in said first cross-sectional region;
    a power supply line that is formed on said interlayer in said first cross-sectional region and that supplies a positive voltage to said circuit element; and
    a ground line that is formed on said interlayer on an opposite side to said circuit element with respect to said power supply line and that is formed in said first cross-sectional region; and
    a preventing diffusion region that is formed in a surface portion of said semiconductor substrate in correspondence to said power supply line, that is formed in said first cross-sectional region, and that is applied with a predetermined positive voltages,
    wherein said interlayer electrically separates said power supply line from said preventing diffusion region in said first cross-sectional region.

2. A semiconductor device according to claim 1, wherein said predetermined positive voltage is equal to said positive voltage supplied from said power supply line.

3. A semiconductor device according to claim 1, wherein said preventing diffusion region is provided substantially directly below said power supply line.

4. A semiconductor device according to claim 1, wherein said semiconductor device is a semiconductor memory device and said circuit element is a memory cell.

5. A semiconductor device according to claim 4, wherein a memory cell transistor is formed in said interlayer.

6. A semiconductor device comprising:
    a circuit element formed in a surface portion of a semiconductor substrate;
    an interlayer formed to cover said semiconductor substrate;
    a power supply line formed on said interlayer to supply a positive voltage to said circuit element; and
    a ground line formed on said interlayer on an opposite side to said circuit element with respective to said power supply line; and
    a preventing diffusion region formed in a surface portion of said semiconductor substrate in correspondence to said power supply line, and applied with a predetermined positive voltage,
    wherein said predetermined positive voltage is lower than said positive voltage supplied from said power supply line.

7. A semiconductor device comprising:

a circuit element formed in a surface portion of a semiconductor substrate;

an interlayer formed to cover said semiconductor substrate;

a power supply line formed on said interlayer to supply a positive voltage to said circuit element; and a ground line formed on said interlayer on an opposite side to said circuit element with respective to said power supply line; and a preventing diffusion region formed in a surface portion of said semiconductor substrate in correspondence to said power supply line, and applied with a predetermined positive voltage, wherein said semiconductor device includes a plurality of said preventing diffusion regions applied with said predetermined positive voltages which are different.

8. A semiconductor device comprising:

a circuit element formed in a surface portion of a semiconductor substrate;

an interlayer formed to cover said semiconductor substrate;

a ground line biased to a ground potential;

a power supply line formed on said interlayer on a side of said circuit element from said ground line to generate a first electric field toward said ground line in said interlayer; and a diffusion region formed in a surface portion of said semiconductor substrate to generate a second electric field toward said ground line in said interlayer such that a movement of a positive ion toward said circuit element is prevented by said first and second electric fields in said interlayer.

9. A semiconductor device according to claim 8, wherein said diffusion region is provided in correspondence to said power supply line.

10. A semiconductor device according to claim 9, wherein said diffusion region is provided substantially directly below said power supply line.

11. A semiconductor device according to claim 8, wherein a predetermined positive voltage is applied to said diffusion region, and said predetermined positive voltage is equal to a positive voltage supplied from said power supply line.

12. A semiconductor device according to claim 8, wherein said semiconductor device is a semiconductor memory device and said circuit element is a memory cell.

13. A semiconductor device according to claim 12 wherein a memory cell transistor is formed in said interlayer.

14. The semiconductor device as claimed in claim 8, wherein said circuit element is located in a first cross-sectional region of said semiconductor device, wherein said interlayer covers said semiconductor substrate in said first cross-sectional region, wherein said ground line and said power supply line are formed on said interlayer in said first cross-sectional region, and wherein said interlayer electrically separates said power supply line from said diffusion region in said first cross-sectional region.

15. A semiconductor device comprising:

a circuit element formed in a surface portion of a semiconductor substrate;

an interlayer formed to cover said semiconductor substrate;

a ground line biased to a ground potential;

a power supply line formed on said interlayer on a side of said circuit element from said ground line to generate a first electric field toward said ground line in said interlayer; and a diffusion region formed in a surface portion of said semiconductor substrate to generate a second electric field toward said ground line in said interlayer such that a movement of a positive ion toward said circuit element is prevented by said first and second electric fields in said interlayer, wherein a predetermined positive voltage is applied to said diffusion region, and said predetermined positive voltage is lower than a positive voltage supplied from said power supply line.

16. A semiconductor device comprising:

a circuit element formed in a surface portion of a semiconductor substrate;

an interlayer formed to cover said semiconductor substrate;

a ground line biased to a ground potential;

a power supply line formed on said interlayer on a side of said circuit element from said ground line to generate a first electric field toward said ground line in said interlayer; and a diffusion region formed in a surface portion of said semiconductor substrate to generate a second electric field toward said ground line in said interlayer such that a movement of a positive ion toward said circuit element is prevented by said first and second electric fields in said interlayer, wherein said semiconductor device includes a plurality of said diffusion regions applied with said predetermined positive voltages which are different.

17. A semiconductor device comprising:

a first circuit element formed in a surface portion of a semiconductor substrate and formed in a first cross-sectional region of said semiconductor device;

an interlayer formed over said semiconductor substrate in said first cross-sectional region;

a first conductive line comprising
   a first power supply line formed over said interlayer in said first cross-sectional region to supply a first voltage to said first circuit element;
   a ground line formed over said interlayer in said first cross-sectional region, wherein said first power supply line is disposed between said ground line and said first circuit element; and
   a first diffusion region formed in a surface portion of said semiconductor substrate corresponding to said first power supply line and formed in said first cross-sectional region, wherein a second voltage is applied to said diffusion region;

a second circuit element formed in said surface portion of said semiconductor substrate;

a second conductive line formed over said interlayer to supply a third voltage to said second circuit element, wherein said second conductive line is disposed between said ground line and said second circuit element; and a second diffusion region formed in said semiconductor substrate at a location corresponding to said second conductive line, wherein a fourth voltage is applied to said second diffusion region.

18. The semiconductor device according to claim 17, wherein said first voltage is a first positive voltage, and wherein said second conductive line is a second power supply line and said third voltage is a second positive voltage.

19. The semiconductor device according to claim 17, wherein said first circuit element is a first memory cell, and wherein said second circuit element is a second memory cell.

20. A semiconductor device comprising:
a first circuit element formed in a surface portion of a semiconductor substrate;
an interlayer formed over said semiconductor substrate;
a first conductive line comprising a first power supply line formed over said interlayer to supply a first voltage to said first circuit element; and
a ground line formed over said interlayer, wherein said first power supply line is disposed between said ground line and said first circuit element; and
a first diffusion region formed in a surface portion of said semiconductor substrate corresponding to said first power supply line, wherein a second voltage is applied to said diffusion region,
wherein said second voltage is less than said first voltage.

21. A semiconductor device comprising:
a first memory cell and a second memory cell formed in a surface portion of a semiconductor substrate;
an interlayer formed over said semiconductor substrate;
a first power supply line formed over said interlayer to supply a first voltage to said first memory cell;
a second power supply line formed over said interlayer to supply a second voltage to said second memory cell;
a ground line formed over said interlayer, wherein first power supply line is disposed between said ground line and said first memory cell and wherein said second power supply line is disposed between said ground line and said second memory cell;
a first diffusion region formed in said semiconductor substrate at a location corresponding to said first power supply line, wherein a third voltage is applied to said first diffusion region; and
a second diffusion region formed in said semiconductor substrate at a location corresponding to said second power supply line, wherein a fourth voltage is applied to said second diffusion region,
wherein said first, second, third, and fourth voltages have the same polarity.

22. The semiconductor device according to claim 2, wherein said first and third voltages are equal and said second and fourth voltages are equal.

23. The semiconductor device according to claim 21, wherein said third voltage is less than said first voltage and said fourth voltage is less than said second voltage.

* * * * *